United States Patent
Shivarama et al.

(10) Patent No.: US 9,253,885 B2
(45) Date of Patent: Feb. 2, 2016

(54) FLEX CIRCUIT HAVING A MULTIPLE LAYERED STRUCTURE AND INTERCONNECT

(71) Applicant: Seagate Technology LLC, Cupertino, CA (US)

(72) Inventors: Ravishankar Ajjanagadde Shivarama, Eden Prairie, MN (US); Bradley J. Ver Meer, Savage, MN (US); Razman Zambri, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 14/594,606

(22) Filed: Jan. 12, 2015

(65) Prior Publication Data

US 2015/0201493 A1   Jul. 16, 2015

Related U.S. Application Data

(62) Division of application No. 13/840,197, filed on Mar. 15, 2013, now Pat. No. 8,934,200.

(60) Provisional application No. 61/638,475, filed on Apr. 25, 2012.

(51) Int. Cl.
*G11B 5/48* (2006.01)
*H05K 1/00* (2006.01)
(Continued)

(52) U.S. Cl.
CPC ............. *H05K 1/111* (2013.01); *G11B 5/486* (2013.01); *G11B 5/4866* (2013.01); *G11B 13/04* (2013.01); *H05K 1/0277* (2013.01); *H05K 1/0298* (2013.01); *H05K 1/115* (2013.01)

(58) Field of Classification Search
None
See application file for complete search history.

(56) References Cited

U.S. PATENT DOCUMENTS 4,761,699 A   8/1988   Ainslie et al.
4,789,914 A   12/1988   Ainslie et al.
(Continued)

FOREIGN PATENT DOCUMENTS

WO   98/20485   5/1998
WO   2011/100021 A2   8/2011

OTHER PUBLICATIONS

International Search Report and Written Opinion dated Jul. 24, 2013 from International Application No. PCT/US2013/038187.
(Continued)

*Primary Examiner* — Thang Tran
(74) *Attorney, Agent, or Firm* — Westman, Champlin & Koehler, P.A.

(57) ABSTRACT

A flex circuit including a multiple layer structure is disclosed. The multiple layered structure includes a first or top layer and a second or base layer. Top traces and bond pads are fabricated on the top or obverse layer and interlayer traces and bond pads are fabricated between the first and second layers to provide an electrical interconnect to electrical components on a head assembly. In an illustrated embodiment, the flex circuit includes portions including the first or base layer and the second or top layer and one or more reduced thickness portion including the first or base layer and not the second layer. In one embodiment, the gimbal portion of the flex circuit includes the first layer and not the second layer of the multiple layer structure and in another embodiment a bending portion of the flex circuit includes the first base layer and not the second layer of the multiple layered structure to provide a reduced thickness to facilitate bending, for example in a micro-actuation region of the load beam.

20 Claims, 9 Drawing Sheets

(51) Int. Cl.
  *H05K 1/11* (2006.01)
  *G11B 13/04* (2006.01)
  *H05K 1/02* (2006.01)

(56) References Cited

U.S. PATENT DOCUMENTS

| | | | |
|---|---|---|---|
| 4,990,724 A | | 2/1991 | Suppelsa et al. |
| 5,384,432 A | | 1/1995 | Noro et al. |
| 5,408,052 A | | 4/1995 | Inaba et al. |
| 5,519,552 A | | 5/1996 | Kohira et al. |
| 5,687,479 A | | 11/1997 | Bennin et al. |
| 5,737,152 A | * | 4/1998 | Balakrishnan ............ 360/245.9 |
| 5,739,982 A | * | 4/1998 | Arya et al. ................ 360/234.5 |
| 5,768,062 A | | 6/1998 | Anderson et al. |
| 5,774,975 A | | 7/1998 | Maffitt et al. |
| 5,808,834 A | | 9/1998 | Jurgenson |
| 5,812,344 A | * | 9/1998 | Balakrishnan ............ 360/245.9 |
| 5,850,320 A | | 12/1998 | Warmka et al. |
| 5,862,010 A | * | 1/1999 | Simmons et al. ......... 360/99.15 |
| 5,864,445 A | * | 1/1999 | Bennin et al. ............. 360/245.9 |
| 5,873,159 A | * | 2/1999 | Arya et al. ................ 29/603.03 |
| 5,889,636 A | | 3/1999 | Arya et al. |
| 5,896,247 A | * | 4/1999 | Pan et al. .................. 360/234.5 |
| 5,896,248 A | | 4/1999 | Hanrahan et al. |
| 5,956,209 A | * | 9/1999 | Shum ........................ 360/244.3 |
| 5,969,906 A | | 10/1999 | Arya et al. |
| 5,986,853 A | * | 11/1999 | Simmons et al. ......... 360/245.9 |
| 5,995,328 A | * | 11/1999 | Balakrishnan ............ 360/245.9 |
| 6,125,015 A | * | 9/2000 | Carlson et al. ............ 360/245.9 |
| 6,134,075 A | | 10/2000 | Bennin et al. |
| 6,351,353 B1 | | 2/2002 | Sluzewski et al. |
| 6,587,310 B1 | | 7/2003 | Bennin et al. |
| 6,714,384 B2 | | 3/2004 | Himes et al. |
| 6,717,277 B2 | | 4/2004 | Chung et al. |
| 6,925,702 B2 | | 8/2005 | Krounbi et al. |
| 6,965,499 B1 | * | 11/2005 | Zhang et al. .............. 360/234.8 |
| 6,975,488 B1 | | 12/2005 | Kulangara et al. |
| 6,985,332 B1 | | 1/2006 | Sluzewski et al. |
| 7,348,494 B1 | | 3/2008 | Handforth et al. |
| 7,384,531 B1 | | 6/2008 | Peltoma et al. |
| 7,571,540 B2 | | 8/2009 | Aonuma et al. |
| 7,710,688 B1 | * | 5/2010 | Hentges et al. ........... 360/245.9 |
| 7,875,804 B1 | | 1/2011 | Tronnes et al. |
| 7,929,248 B2 | | 4/2011 | Zhu et al. |
| 8,094,413 B1 | * | 1/2012 | Hentges et al. ........... 360/245.9 |
| 8,144,429 B2 | | 3/2012 | Kato |
| 8,169,746 B1 | * | 5/2012 | Rice et al. ................. 360/245.9 |
| 8,208,224 B1 | * | 6/2012 | Teo et al. ................... 360/245.3 |
| 8,254,212 B2 | | 8/2012 | Snyder et al. |
| 8,259,540 B1 | | 9/2012 | Sahoo et al. |
| 8,279,558 B2 | | 10/2012 | Limmer et al. |
| 8,295,011 B2 | * | 10/2012 | Chou et al. ................ 360/234.5 |
| 8,351,158 B2 | | 1/2013 | Zhu et al. |
| 8,411,391 B2 | | 4/2013 | Hirata et al. |
| 8,411,535 B1 | | 4/2013 | Hirano et al. |
| 8,427,783 B2 | | 4/2013 | Tsuchiya et al. |
| 8,477,459 B1 | * | 7/2013 | Pan ............................ 360/245.9 |
| 8,488,279 B1 | * | 7/2013 | Pan et al. .................. 360/245.9 |
| 8,705,210 B2 | | 4/2014 | Arai |
| 2005/0095878 A1 | | 5/2005 | Palanisamy |
| 2006/0114610 A1 | | 6/2006 | Krause et al. |
| 2007/0115590 A1 | * | 5/2007 | Resh et al. ................. 360/244.3 |
| 2007/0297094 A1 | * | 12/2007 | Sassine ...................... 360/245.9 |
| 2008/0002298 A1 | | 1/2008 | Sluzewski |
| 2008/0094753 A1 | | 4/2008 | Brodkin et al. |
| 2008/0170326 A1 | * | 7/2008 | Feng et al. ................. 360/99.04 |
| 2009/0195930 A1 | | 8/2009 | Lille |
| 2010/0007980 A1 | * | 1/2010 | Kim et al. ....................... 360/59 |
| 2010/0085664 A1 | * | 4/2010 | Hirata et al. ............... 360/245.4 |
| 2010/0195251 A1 | * | 8/2010 | Nojima et al. ............. 360/245.3 |
| 2012/0008470 A1 | | 1/2012 | Shimazawa et al. |
| 2012/0044790 A1 | * | 2/2012 | Shimazawa et al. ....... 369/13.32 |
| 2012/0045662 A1 | | 2/2012 | Zou et al. |
| 2012/0050917 A1 | | 3/2012 | Limmer et al. |

OTHER PUBLICATIONS

Peter Macleod: "A Review of Flexible Circuit Technology and Its Applications," PRIME Faraday Partnership, 2002, XP002710090, Retrieved from the Internet: URL:http://www.lboro.ac.uk/microsites/mechman/research/ipm-ktn/pdf/Technology_review/flexible-circuit-technology-and-its-applications.pdf.

International Search Report and Written Opinion dated Aug. 19, 2013 from International Application No. PCT/US2013/038189.

Office Action for U.S. Appl. No. 13/839,342, dated Feb. 11, 2014, 8 pages.

Notice of Allowance for U.S. Appl. No. 13/839,342, dated Jun. 5, 2014, 5 pages.

* cited by examiner

FLEX CIRCUIT HAVING A MULTIPLE LAYERED STRUCTURE AND INTERCONNECT

CROSS-REFERENCE TO RELATED APPLICATION

This application is a divisional application of U.S. application Ser. No. 13/840,197 filed on Mar. 15, 2013, which claims priority to and the benefit of U.S. Provisional Application No. 61/638,475 filed on Apr. 25, 2012 for a "Selective Dual Layer Circuit for Laser on Slider HAMR Design", the contents of the Provisional Application (No. 61/638,475) and the prior Utility Application (Ser. No. 13/840,197) are hereby incorporated by reference in their entirety.

BACKGROUND

Data storage devices store digitally encoded data on disc or other magnetically encoded media. Demand for increased data storage has resulted in demand for higher recording density. Heat assisted magnetic recording uses heating elements or lasers to apply heat to magnetic media to enhance recording density. The addition of heat assisted magnetic recording increases the required number of traces and bond pads on a flex circuit to interconnect to the additional electrical components on the head or suspension assembly. Embodiments of the present invention provide solutions to these and other problems, and offer other advantages over the prior art.

SUMMARY

The present application relates to a flex circuit including a multiple layered structure and interconnect. In embodiments disclosed, the flex circuit includes a flexible structure including an elongate body and an interconnect portion. In an illustrated embodiment, the multiple layered structure includes top traces and bond pads and interlayer traces and bond pads to provide an electrical interconnect to multiple electrical components on the head assembly. In embodiments described, the flex circuit includes segments including a first or base layer and a second or top layer and one or more reduced thickness portions including the first or base layer and not the second or top layer. In one embodiment, the gimbal portion of the flex circuit includes the first layer and not the second layer of the multiple layer structure and in another embodiment a bending portion of the flex circuit includes the first base layer and not the second layer of the multiple layered structure to provide a reduced thickness to facilitate bending, for example, in a micro-actuation region of the load beam.

Other features and benefits that characterize embodiments of the present invention will be apparent upon reading the following detailed description and review of the associated drawings.

DETAILED DESCRIPTION OF ILLUSTRATIVE EMBODIMENTS

Figure 1:
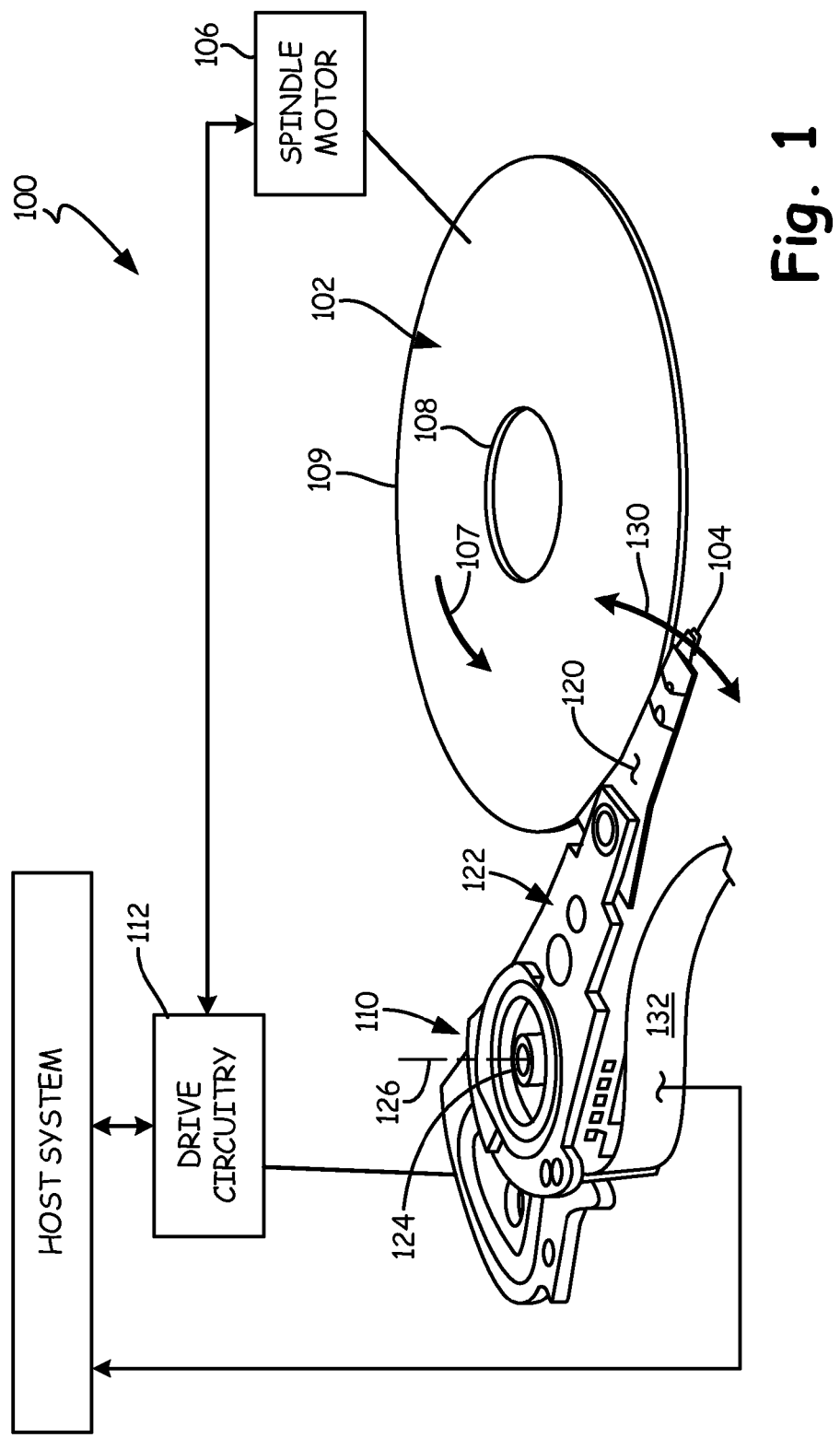
FIG. 1 is a schematic illustration of a data storage device in which embodiments of the present application are used.

The present application relates to a flex circuit having application for providing an electrical connection to transducer or electrical components of a data storage device of the type illustrated in FIG. 1. The data storage device 100 shown in FIG. 1 includes a data storage media 102 to store digitally encoded data. A head assembly 104 is positioned above the media 102 to read data from and/or write data to the data storage media 102. In the embodiment shown, the data storage media 102 is a rotating disc. For read and write operations, a spindle motor 106 (illustrated schematically) rotates the media 102 as illustrated by arrow 107 and an actuator mechanism 110 positions the head assembly 104 relative to data tracks on the rotating media 102 between an inner diameter 108 and an outer diameter 109 of the rotating media. Both the spindle motor 106 and actuator mechanism 110 are connected to and operated through drive circuitry 112 (schematically shown). In the illustrated embodiment, the head assembly 104 includes one or more transducer elements (not shown in FIG. 1) to read data from or write data to the data storage media 102.

Figure 2A:
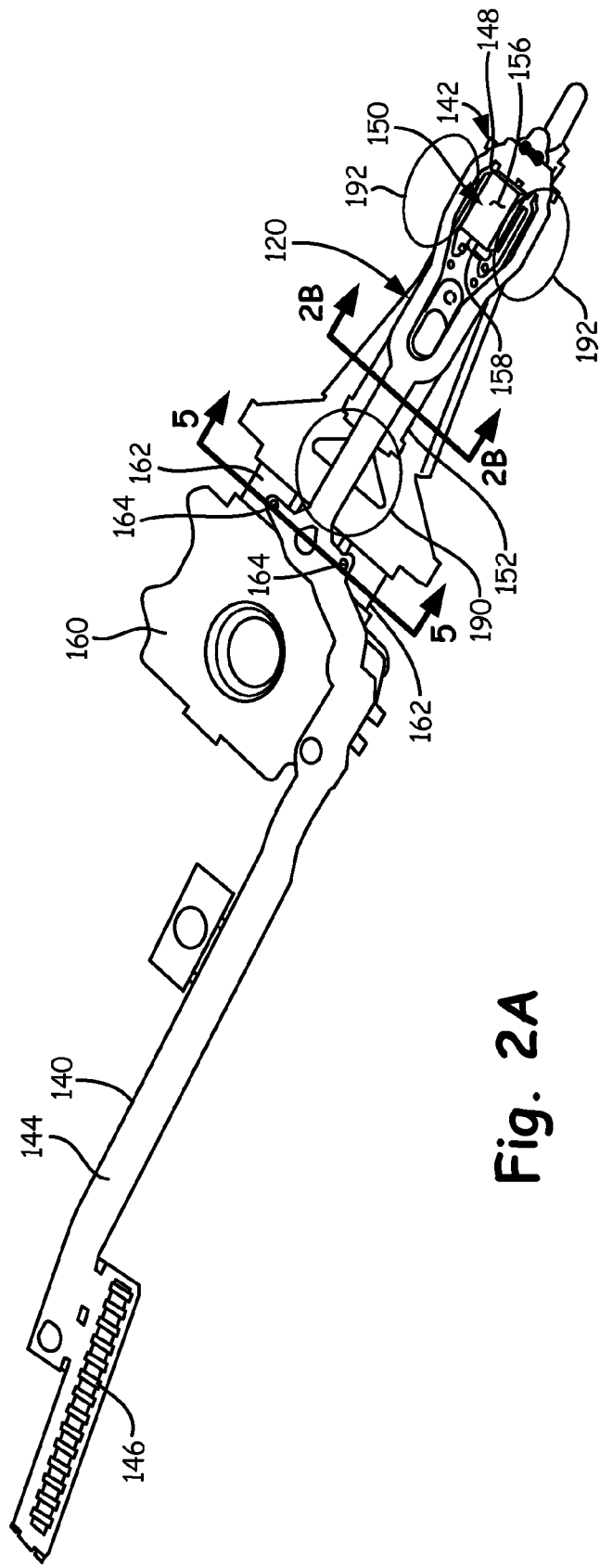
FIG. 2A illustrates an embodiment of a flex circuit for a suspension assembly including a multiple layered structure and interconnect.

The head assembly 104 is coupled to the actuator mechanism 110 through a suspension assembly. As shown in FIG. 1, the suspension assembly includes a load beam 120 connected to an actuator arm 122 of the mechanism 110 for example through a swage connection. Although FIG. 1 illustrates a single load beam coupled to the actuator mechanism 110, additional load beams and head assemblies 104 can be coupled to the actuator mechanism 110 to read data from or write data to multiple discs of a disc stack. The actuator mechanism 110 is rotationally coupled to a frame or deck (not shown) through a bearing 124 to rotate about axis 126. Rotation of the actuator mechanism 110 moves the head assembly 104 in a cross track direction as illustrated by arrow 130. The one or more transducer elements of the head assembly 104 are electrically coupled to head circuitry 132 to encode data on the data storage media 102 and decode data from the data storage media 102 through a flex circuit 140 of the type illustrated in FIG. 2A.

The flex circuit 140 includes a flexible structure including an interconnect portion 142 and a tail portion 144. A plurality of traces are formed along the length of the flex circuit 140 to form a connecting portion (along tail portion 144) and the interconnect portion 142 to electrically connect elements of the head assembly 104 to the head circuitry 132. The traces are connected to head circuitry 104 through contacts 146 on tail portion 144. In an illustrated embodiment, the head assembly includes one or more transducer elements (not shown in FIG. 2) fabricated on a trailing edge 148 of a slider or slider body 150. The slider 150 is coupled to the load beam 120 through a gimbal spring 152. Rotation of the media creates an air flow along an air bearing surface (ABS) 156 of the slider from a leading edge 158 to the trailing edge 148 of the slider to read data from and write data to the media.

As shown, the load beam is coupled to a mounting plate 160 swaged to actuator arm 122 as shown in FIG. 1. In the illustrated embodiment, the suspension assembly includes a micro-actuator assembly energizeable to adjust the position of the head assembly 104 in the cross-track direction 130 to move the head assembly inwardly or outwardly (towards or away) with respect to the inner and outer diameters 108, 109 of the media. In the illustrated embodiment the micro-actuator assembly includes opposed spaced piezoelectric beams 162 connecting the mounting portion 160 to the load beam 120. In an illustrated embodiment, the piezoelectric beams 162 are coupled to traces on the flex circuit 140 through contacts 164. The contacts 164 are connected in reverse polarity to circuitry to cooperatively extend and retract the beams 162 to move the head assembly 104 in the cross-track direction as illustrated by arrow 130. For example, the inner beam is extended and the outer beam is retracted to move the head in an outward direction toward the outer diameter 109 and the outer beam is extended and the inner beam retracted to move the head in an inward direction toward the inner diameter 108 of the media 102.

Figure 2B:
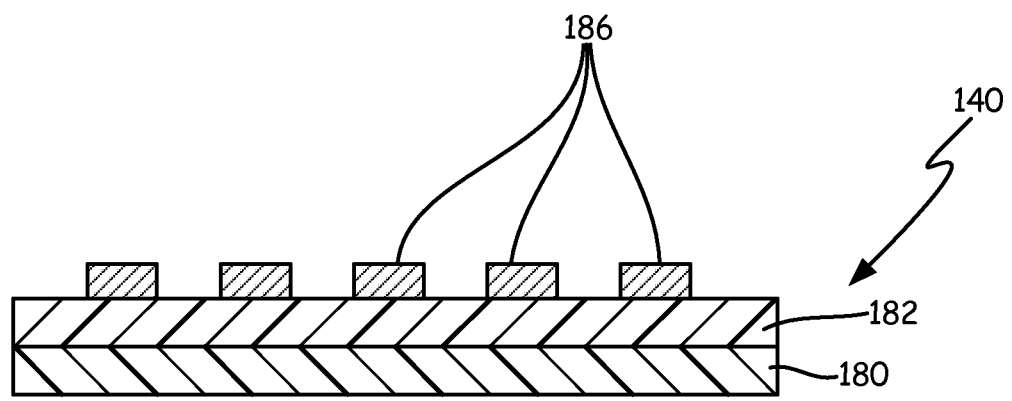
FIG. 2B is a cross-sectional view of an embodiment of a multiple layered flex circuit as taken along line 2B-2B of FIG. 2A.
Figure 2C:
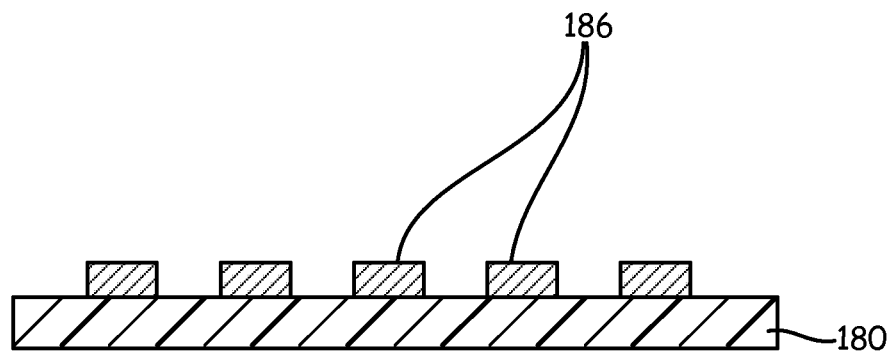
FIG. 2C is a cross-sectional illustration of a reduced thickness region of an embodiment of the flex circuit including a first base layer and not the second or top layer.
Figure 2D:
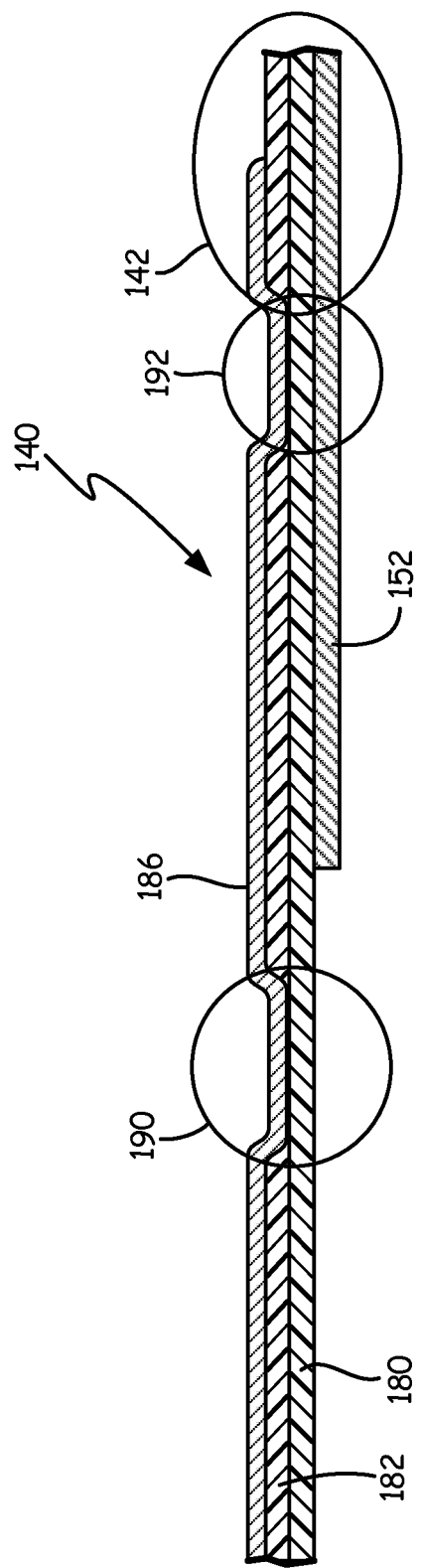
FIG. 2D illustrates an embodiment of the multiple layered flex circuit of FIG. 2A include a bending portion and gimbal portion having a reduced thickness formed of the first base layer and not the second top layer.

As shown, in FIG. 2B, in the illustrated embodiment, the flex circuit 140 includes a multiple layered flexible structure having a first insulating or base layer 180 and a second insulating layer 182 on the first layer 180. As shown, conductive traces 186 are formed on the second layer 182 to interconnect with electrical components of the head assembly 104. In an illustrated embodiment, the first and second insulating layers 180, 182 are formed of a polyimide or other flexible material. The flex circuit can include additional layers including a top protective layer in addition to the multiple insulating layers 180, 182 shown. The multiple layered structure increases rigidity of the flex circuit which reduces flexibility in the bending and gimbal regions of the suspension assembly. In the illustrated embodiment shown in FIG. 2A, gimbal and bending regions 190, 192 of the flex circuit 140 includes the first layer 180 having the traces 186 formed thereon and not the second layer 182 as shown in FIG. 2C. Thus, as shown, in FIG. 2D, traces 186 (only one shown in FIG. 2D) are formed on the second layer 182 along portions of the flexible circuit 140 and along the first layer 180 along the bending and gimbal portions 190, 192 including the first layer 180 and not the second layer 182. Thus, the multiple layer structure facilities different thickness portions to provide variable flexibility along regions of the suspension assembly.

Figure 3A:
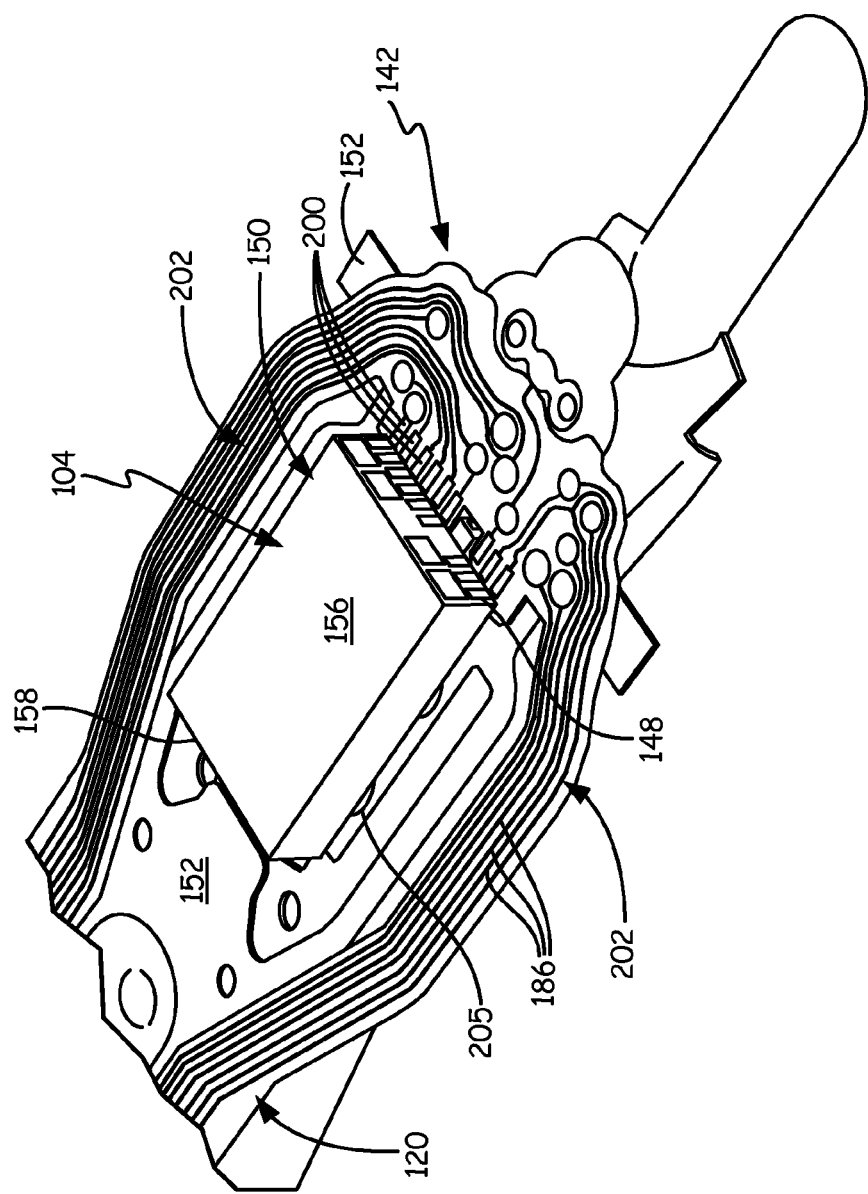
FIG. 3A is a detailed illustration of an embodiment of an interconnect portion of the flex circuit illustrated in FIG. 2A.

FIG. 3A is a detailed illustration of an embodiment of the interconnect portion 142 providing the electrical interface to one or more electrical elements of the head assembly 104. The interconnect portion 142 includes a plurality of bond pads 200 coupled to the traces 186 along spaced gimbal arms 202 of the flex circuit extending along opposed sides of the slider 150 to electrically connect the transducer elements on the head assembly 104 to the head circuitry 132. As previously described the flexible structure of the gimbal portion or arms 202 includes the first layer 180 and not the second layer 182 and the interconnect portion 142 includes the multiple layered structure including the first and second layers 180, 182. In an illustrated embodiment, the traces 186 and bond pads 200 are formed of copper or other conductive material.

Figure 3B:
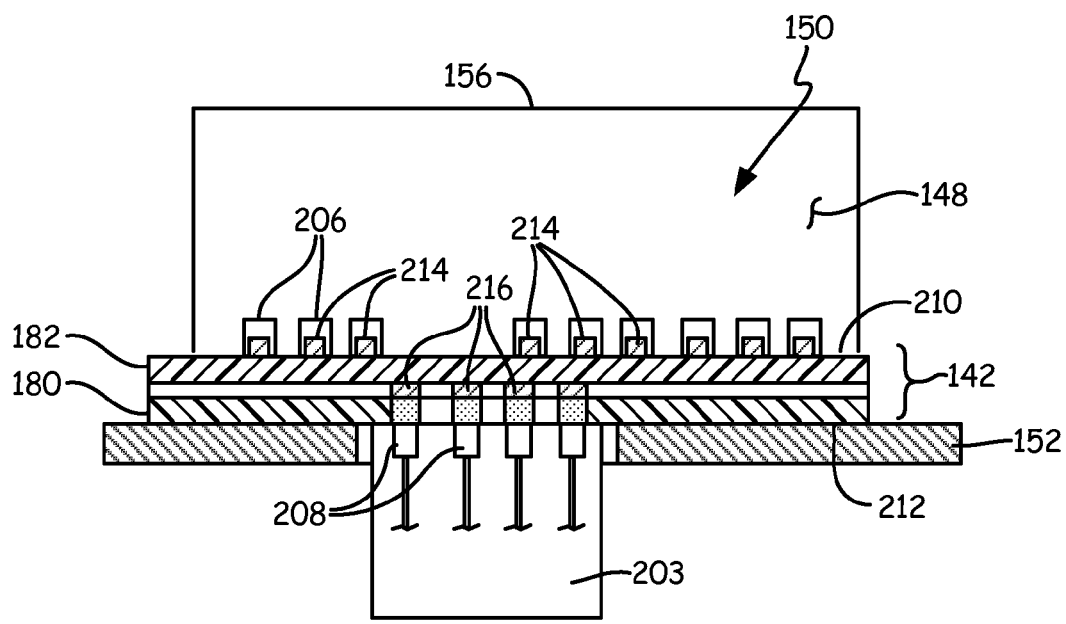
FIG. 3B illustrates an embodiment of a multiple layered interconnect portion including top and interlayer bond pads for connection to transducer elements of the slider and heating elements of a HAMR unit.

In the illustrated embodiment, the head assembly 104 includes the slider 150 and a heat assisted magnetic recording the HAMR unit 203 shown in FIG. 3B to heat the media to enhance magnetic recording. The multiple layer structure of the flex circuit shown in FIG. 3B facilitates connection to the transducer elements on the slider and one or more heating elements on a HAMR unit 203. As cooperatively shown, the slider 150 is coupled to a tab portion 205 (shown in FIG. 3A) of the gimbal spring 152 and the flex circuit 140 is coupled to the gimbal spring 152. The HAMR unit 203 is coupled to a back side of the slider 150 opposite the air bearing surface 156. The HAMR unit 203 includes one or more heating or HAMR elements such as a laser diode and/or heat source to deliver heat to the media through a wave guide (not shown) fabricated on the slider 150 to enhance magnetic recording. Traces 186 on the flex circuit are coupled to the transducer elements on the slider 150 through bond pads 206 on the slider and to electrical or heating elements on the HAMR unit 203 through bond pads 208 on the HAMR unit 202.

Figure 3C:
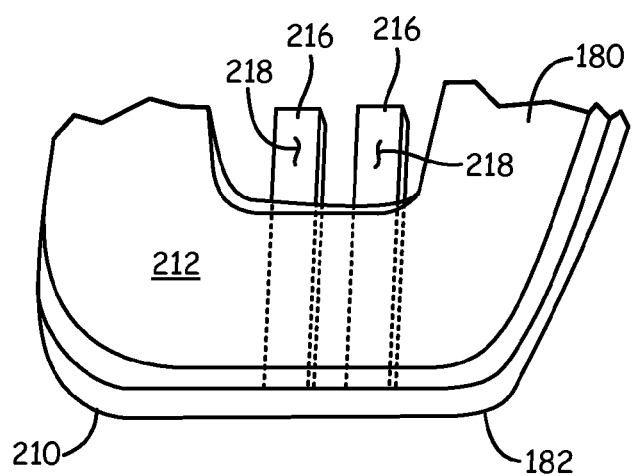
FIG. 3C is a detailed illustration of the interlayer bond pads of the flex circuit illustrated in FIG. 2A.

As illustrated in FIG. 3B, the multiple layered structure of the interconnect portion 142 has an obverse side 210 and reverse side 212. The structure includes obverse side bond pads 214 formed on the second or top layer 182 of the multiple layered structure and interlayer bond pads 216 formed between the first and second layers 180, 182. The obverse side bond pads 214 formed flex circuit slider bond pads configured connect to the bond pads 206 on the slider. The interlayer bond pads 216 form flex circuit HAMR bond pads configured to connect to the bond pads 208 on the HAMR unit 203. As shown in FIG. 3C the interlayer bond pads 216 protrude from an edge of the flexible structure to provide a reverse bonding surface 218 to define the reverse side bond pads configured to connect to the bond pads 208 on the HAMR unit 203 on the back side of the slider 150.

Figure 4A:
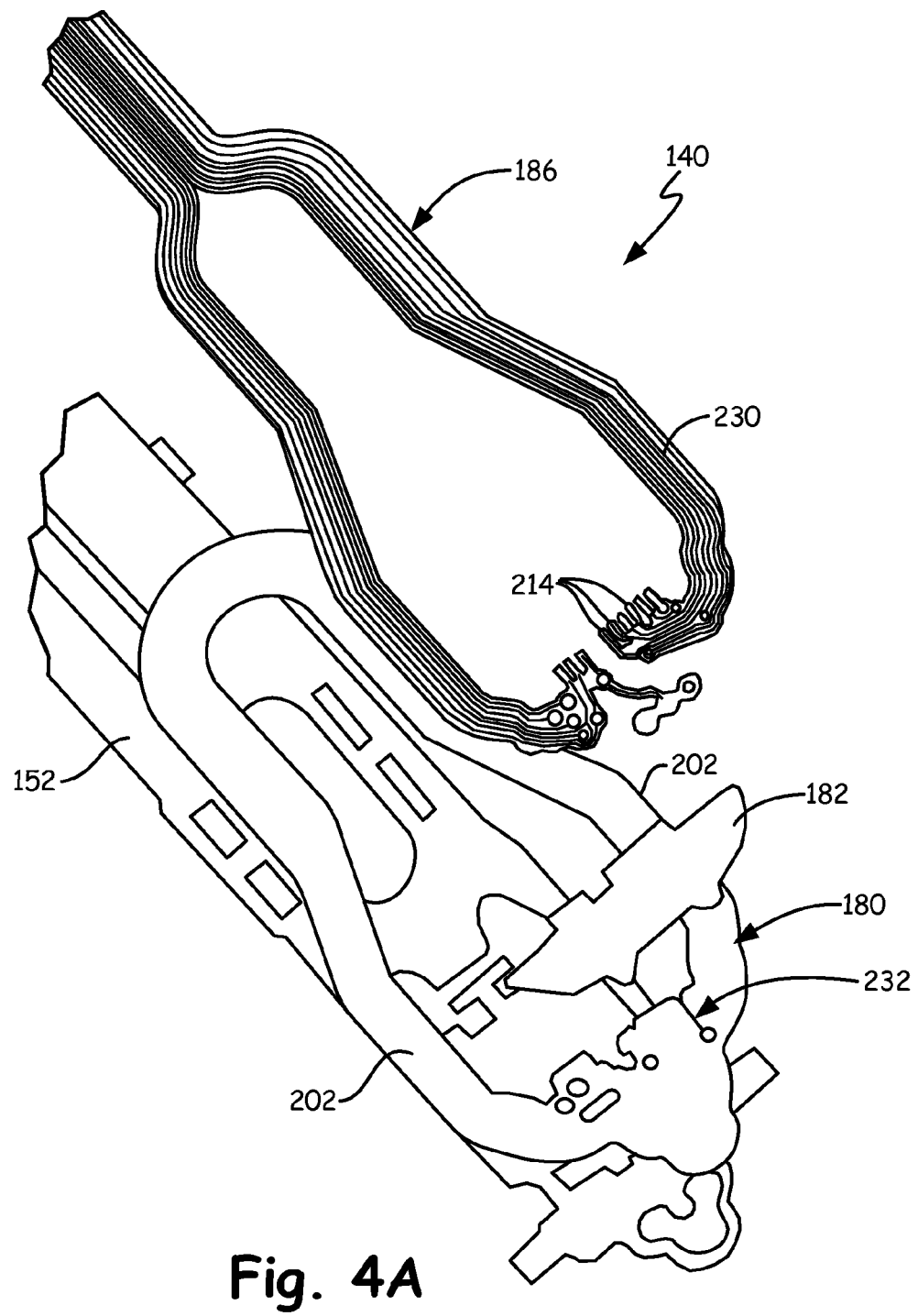
FIG. 4A is an exploded view of an interconnect portion of the flex circuit including a multiple layered structure including top and interlayer traces and bond pads.

FIG. 4A illustrates an exploded view of the interconnect portion 142 of the flex circuit and gimbal spring 152. As shown, the interconnect portion of flexible structure includes the first or base layer 180 and second layer 182 which forms the top or obverse layer. Top traces 230 on the obverse side of the flexible structure extend along the first layer 180 along the gimbal arms 202 of the flex circuit and along the second or top layer 182 of the interconnect portion 142. Interlayer traces 232 connect to one or more of the top side traces 230 through conductive vias extending through the second layer 182. Top and interlayer traces 230, 232 include slider traces connected to the slider bond pads 214 on the obverse or second layer 182 and HAMR traces connected to the interlayer bond pads 216 forming the HAMR bond pads as previously described.

Figure 4B:
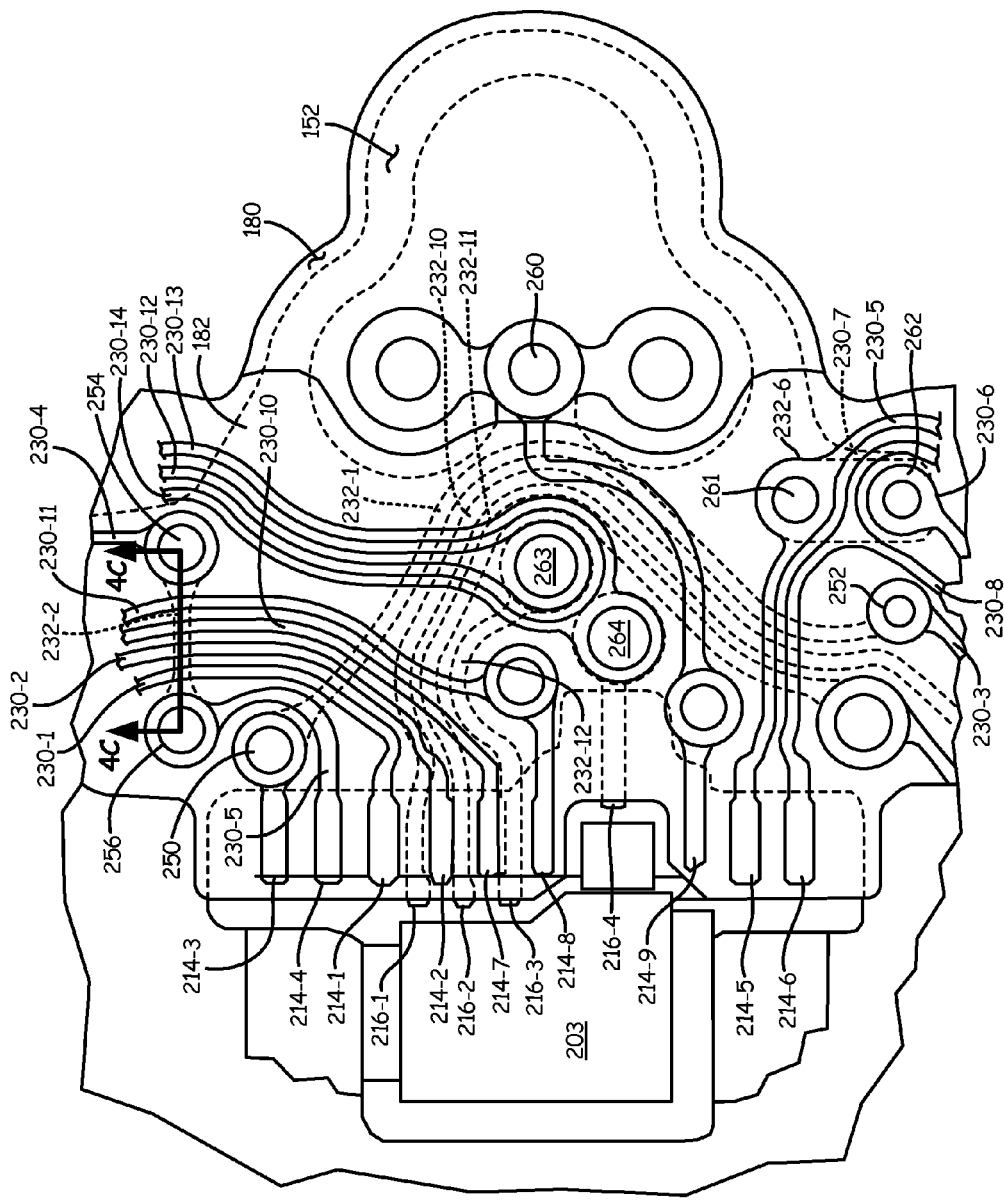
FIG. 4B schematically illustrates an embodiment of top and interlayer traces and bond pads of an interconnect portion of an embodiment of a flex circuit of the type illustrated in FIG. 2A.

FIG. 4B is a detailed illustration of an embodiment of an interconnect portion design for slider traces and HAMR traces coupled to slider bond pads 214-1 through 214-9 on the top or obverse layer and HAMR or interlayer bond pads 216-1 through 216-4 (shown in dotted line). In the illustrated embodiment, the slider bond pads include read element pads 214-1 through 214-2, heater bond pads 214-3 through 214-4, writer pads 214-5 through 214-6, thermal asperity pads 214-7 through 217-8 and ground pad 214-9. Read pads 214-1 through 214-2 are coupled to top or obverse layer traces 230-1 and 230-2 on the second or top layer 182. Heater bond pad 214-3 is coupled to top trace 230-3 through interlayer trace 232-1. As shown, the bond pad 214-3 is connected to interlayer trace 232-1 at terminal 250 and to top or obverse trace 230-3 at terminal 252.

Heater pad 214-4 is coupled to top trace 230-4 through interlayer trace 232-2 connected to heater pad 214-3 through top trace 230-5. Top trace 230-4 is connected to interlayer trace 232-2 at terminal 254 and to top trace 230-5 at terminal 256. Writer pad 214-5 is coupled multiple top traces 230-5, 230-6 through an interlayer trace or conductive path 232-6 at terminals 261, 262. Writer pad 214-6 is coupled to multiple top traces 230-7 and 230-8. Thermal asperity pads 214-7 and 214-8 are coupled to top traces 230-10 and 230-11. Ground pad 214-9 is coupled to ground via connection to ground terminal 260 conductively coupled to gimbal spring 152.

HAMR or interlayer pads 216-1 and 216-2 for a photo diode element are coupled to top traces (not numbered) through interlayer traces 232-10 and 232-11. HAMR or interlayer pad 216-3 for a laser element is coupled to top trace 230-12 through interlayer trace 232-12 at terminal 263. Interlayer pad 216-4 for the laser element is coupled to top or obverse traces 230-13 and 230-14 through terminal 264.

Figure 4C:
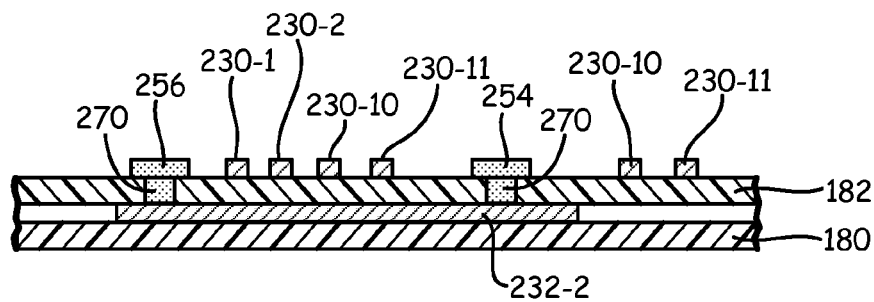
FIG. 4C is a cross-sectional view of the multiple layered structure of an interconnect portion taken along line 4C-4C of FIG. 4B.

FIG. 4C is a cross-sectional view along line FIG. 4C-4C of FIG. 4B and illustrates connection of top layer traces 230 or bond pads 214 to interlayer traces 232 through conductive vias 270 extending through the second or top layer 182. The particular cross-section shown illustrates connection of heater trace 230-5 coupled to heater bond pad 214-4 to interlayer trace 232-2 at terminal 156 and connection of interlayer trace 232-2 to top layer trace 230-4 at terminal 254. Thus, the top layer or obverse trace is routed to an interlayer trace to facilitate the multiple connections within the form factor interconnect. Similarly other top and interlayer traces are connected through conductive vias at terminals 252, 261, 262, 263, 264 as previously described to provide an interconnect design with space to accommodate multiple electrical elements of the head assembly.

Figure 5:
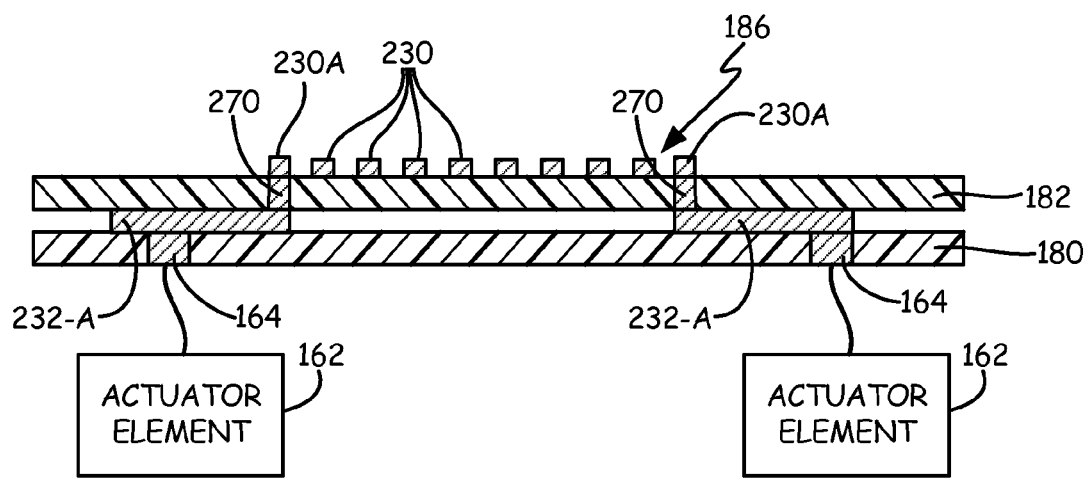
FIG. 5 illustrates a multiple layered structure of the flex circuit including interlayer traces and contact terminals for connection to micro-actuator elements coupled to a load beam as taken along line 5-5 of FIG. 2A.

FIG. 5 illustrates the multiple layer section of the flex circuit 140 including a microactuator interconnect to connect traces to the actuator elements 162 for operation. As shown, top traces 230 formed on the obverse side or top layer 182 of the multiple layer structure include microactuator traces 230A connected to reverse side contacts 164 through interlayer traces 232A as shown. The top layer or actuator traces 230A are coupled to the interlayer traces 232A through conductive vias 270 extending through the top or second layer 182 to connect to contacts 164 to energize the micro-actuator elements. Thus, as described segments of the flex circuit include multiple layers including the first and second layers and other segments include a first layer and not the second layer to reduce thickness. Although the flex circuit is described with first and second layers, embodiments are not limited to first and second layers and additional layers or top layers can be included in the multiple layer segment or the segments including the first insulating layer and not the second. The multiple layer flex circuit described can be fabricated using thin film deposition techniques to deposit and etch the multiple layers to form the multiple segments including the reduced thickness segments and to form the top or obverse bond pads or traces and the interlayer bond pads and traces.

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application while maintaining substantially the same functionality without departing from the scope and spirit of the present invention. In addition, although the preferred embodiment described is related to flex circuit having application for a HAMR application, it will be appreciated by those skilled in the art that the teachings of the present invention can be applied to other head interconnect applications, without departing from the scope and spirit of the present invention.

What is claimed is:

1. A flex circuit comprising:
   an elongate flexible structure including a first insulating layer and a second insulating layer; and
   one or more conductive traces and one or more bond pads on an obverse side of the elongate flexible structure coupled to the one or more conductive traces on the obverse side of the elongate flexible structure; and
   one or more interlayer conductive traces between the first and second insulating layers and one or more interlayer bond pads coupled to the one or more interlayer conductive traces protruding from an edge of the elongate flexible structure to provide a reverse side bonding surface on a reverse side of the elongate flexible structure.

2. The flex circuit of claim 1 wherein the one or more conductive traces on the obverse side of the elongate flexible structure are formed along the second insulating layer and comprising a plurality of traces on the first insulating layer coupled to the one or more conductive traces on the second insulating layer and the one or more interlayer conductive traces.

3. The flex circuit of claim 2 wherein the one or more interlayer conductive traces are coupled to the plurality of traces on the first insulating layer through vias extending through the second insulating layer.

4. An assembly comprising
   a flex circuit including an elongate body having an interconnect portion including a flexible multiple layer structure including a first insulating layer and a second insulating layer having an obverse side and a reverse side; and
   a plurality of slider and heat assisted magnetic recording (HAMR) traces;
   a plurality of slider bond pads on an obverse side of the flexible multiple layered structure conductively coupled to the slider traces; and
   a plurality of interlayer bond pads coupled to the HAMR traces through interlayer traces between the first and second insulating layers and the interlayer bond pads protruding from an edge of the flexible multiple layered structure to provide a reverse side bonding surface.

5. The assembly of claim 4 wherein the HAMR traces are formed along the second insulating layer of the flexible multiple layered structure and are coupled to the interlayer traces through vias extending through the second layer.

6. The assembly of claim 4 wherein the plurality of slider bond pads are formed on the second insulating layer and are conductively coupled to the slider traces on the second layer.

7. The assembly of claim 4 wherein the flex circuit includes a reduced thickness gimbal portion between the interconnect portion and a tail portion of the flex circuit and the gimbal portion includes the first insulating layer and not the second insulating layer and the plurality of slider and HAMR traces are formed along the first insulating layer of the gimbal portion.

8. The assembly of claim 4 wherein the body of the flex circuit includes a reduced thickness segment including the first insulating layer and not the second insulating layer and the plurality of slider bond pads are formed on the second insulating layer and connect to the slider traces on the first insulating layer of the reduced thickness segment and the second insulating layer of the interconnect portion and the interlayer traces connect to the HAMR traces on the first insulating layer through HAMR traces on the second insulating layer of the interconnect portion.

9. The assembly of claim 4 wherein the flex circuit includes a bending portion between the interconnect portion and an end connection of the flex circuit and the bending portion includes the first insulating layer and not the second insulating layer and the plurality of slider and HAMR traces are formed along the first insulating layer of the bending portion.

10. The assembly of claim 4 wherein the elongate body includes a multiple layered microactuator interconnect including one or more actuator traces and interlayer traces coupled to actuator contacts and connected to the actuator traces through conductive vias extending through the flexible multiple layered structure.

11. A flex circuit comprising:
an elongate flexible structure having an elongate body including a first insulating layer and a second insulating layer, the body comprising an interconnect portion,
wherein the interconnect portion includes the first and second insulating layers and multiple layers of traces including one or more obverse side traces over the second insulating layer coupled to one or more obverse side bond pads and one or more interlayer traces between the first and second insulating layers coupled to one or more reverse side bond pads.

12. The flex circuit of claim 11 and wherein the one or more interlayer traces are coupled to the one or more obverse side traces through vias extending through the second insulating layer.

13. The flex circuit of claim 11 and wherein the one or more obverse side bond pads are configured to couple to transducer elements on a slider.

14. The flex circuit of claim 11 and wherein the one or more reverse side bond pads are configured to couple to a heat assisted magnetic recording (HAMR) unit.

15. The flex circuit of claim 11 and wherein the body further comprises a tail portion and a bending portion between the interconnect portion that includes the first and second insulating layers and the tail portion.

16. The flex circuit of claim 15 and wherein the bending portion includes the first insulating layer and not the second insulating layer.

17. The flex circuit of claim 16 and wherein the bending portion includes one layer of traces over the first insulating layer that couple to the obverse side traces over the second insulating layer in the interconnect portion.

18. The flex circuit of claim 17 and wherein the elongate body includes a multiple layered microactuator interconnect including one or more actuator traces and interlayer traces coupled to actuator contacts and connected to the actuator traces through conductive vias extending through the multiple layered microactuator interconnect.

19. The flex circuit of claim 11 and wherein the one or more interlayer traces protrude from an edge of the elongate flexible structure.

20. The flex circuit of claim 11 and wherein the one or more obverse side bond pads are configured to couple to transducer elements on a slider.

* * * * *